(12) United States Patent  
Cheah et al.

(10) Patent No.: US 9,048,920 B2  
(45) Date of Patent: Jun. 2, 2015

(54) METHOD AND APPARATUS FOR REDUCING FM AUDIO ARTIFACTS IN A RECEIVER

(75) Inventors: Chow Loong Cheah, Ipoh (MY); Kar Boon Oung, Gelugor (MY); V. C. Prakash V K Chacko, Penang (MY)

(73) Assignee: Motorola Solutions, Inc., Schaumburg, IL (US)

( * ) Notice: Subject to any disclaimer, the term of this patent is extended or adjusted under 35 U.S.C. 154(b) by 0 days.

(21) Appl. No.: 14/389,259

(22) PCT Filed: Mar. 30, 2012

(86) PCT No.: PCT/MY2012/000070  
§ 371 (c)(1),  
(2), (4) Date: Sep. 29, 2014

(87) PCT Pub. No.: WO2013/147581  
PCT Pub. Date: Oct. 3, 2013

(65) Prior Publication Data  
US 2015/0071392 A1  Mar. 12, 2015

(51) Int. Cl.  
*H04B 1/10*  (2006.01)  
*H04B 1/12*  (2006.01)

(52) U.S. Cl.  
CPC ..................... *H04B 1/123* (2013.01)

(58) Field of Classification Search  
USPC .......................... 375/350, 343, 346, 284, 285  
See application file for complete search history.

(56) References Cited

U.S. PATENT DOCUMENTS

| | | | |
|---|---|---|---|
| 6,384,773 B1* | 5/2002 | Martin et al. | 342/202 |
| 6,597,748 B1 | 7/2003 | Hietala et al. | |
| 2002/0168951 A1 | 11/2002 | Paulus et al. | |
| 2004/0147238 A1 | 7/2004 | Wang et al. | |
| 2005/0084033 A1* | 4/2005 | Rosen et al. | 375/295 |
| 2005/0100076 A1* | 5/2005 | Gazdzinski et al. | 375/130 |
| 2006/0154639 A1 | 7/2006 | Malone et al. | |
| 2008/0032660 A1 | 2/2008 | Clark et al. | |
| 2010/0061485 A1* | 3/2010 | Clark et al. | 375/319 |
| 2010/0130156 A1* | 5/2010 | Jin et al. | 455/296 |
| 2010/0144303 A1 | 6/2010 | Stogner et al. | |
| 2011/0086606 A1* | 4/2011 | Chen et al. | 455/323 |

FOREIGN PATENT DOCUMENTS

| | | |
|---|---|---|
| EP | 1058396 A1 | 6/2000 |
| WO | 0131798 A1 | 5/2001 |
| WO | 2005101671 A2 | 10/2005 |

OTHER PUBLICATIONS

Mark Goldberg "Method to Estimate Imbalances Due to Zero-IF Down-Conversion".  
Corresponding International Application No. PCT/MY2012/000070—International Search Report Dated Nov. 26, 2012.

* cited by examiner

*Primary Examiner* — Qutbuddin Ghulamali  
(74) *Attorney, Agent, or Firm* — Barbara R. Doutre

(57) ABSTRACT

An apparatus and method for reducing FM audio artifacts in a receiver are provided. A direct conversion radio frequency (RF) receiver converts an analog FM signal into a phase shifted digital low IF signal. A digital controller coupled to the analog FM receiver provides adaptive frequency translation for different channel spacing and provides adaptive low IF configuration through the different channel spacing, thereby suppressing audio artifacts.

17 Claims, 10 Drawing Sheets

METHOD AND APPARATUS FOR REDUCING FM AUDIO ARTIFACTS IN A RECEIVER

CROSS-REFERENCE TO RELATED APPLICATIONS

This application claims priority to PCT Application Ser. No. PCT/MY12/00070, filed Mar. 30, 2012, entitled "METHOD AND APPARATUS FOR REDUCING FM AUDIO ARTIFACTS IN A RECEIVER" the contents of which are incorporated herein by reference.

FIELD OF THE DISCLOSURE

The present disclosure relates generally to wireless communication systems and more particularly to reducing FM audio artifacts in a receiver.

BACKGROUND

Direct conversion receivers immediately down convert a received radio signal to a baseband signal thereby completely eliminating the need for an intermediate frequency (IF) stage. Direct conversion receivers are often referred to as Zero IF receivers. Such receivers suffer from the formation of a very large, unwanted DC component interfering with the baseband signal, formed largely by leakage from the local oscillator being received at the antenna along with the desired RF signal. The DC component may be further impacted by temperature, baseband circuit characteristics, IC processes, and/or transients to name a few. The DC component also affects offsets of the amplifiers and mixers in the receiver.

The design of a direct conversion receiver (Zero IF) faces two main challenges in analog FM Applications. The first challenge pertains to the DC offset error present in the baseband signal. The second challenge pertains to baseband imbalance caused by gain and phase imbalance in the mixers.

Past approaches for addressing the DC offset error and gain/phase imbalance have included applying a high pass filter after the analog-to-digital converter (ADC). The high pass filter approach however, is not acceptable for analog FM radio applications, especially when the radio is operating in a subaudible signalling mode, such as FM digital private line (DPL) mode, Tone private line (PL) mode, where a low level digital signal is transmitted rather than a continuous audio tone, or other mode where low frequency sub-audible signals are present. The subaudible signals can be further distorted by the high pass filter and generate spurious signals that fall within the FM audio spectrum. Similarly, the imbalance present in the down mixed signal may also distort the FM demodulated audio signal. The resulting audio distortions are often referred to as FM audio artifacts which are considered undesirable from the radio user point of view.

A very low IF receiver, as opposed to a Zero IF receiver, is one in which the received signal is first down-converted to be centered about an IF which is equal to half the channel spacing (i.e. half the bandwidth of the wanted signal), and then it is down-converted again to baseband. While low IF receivers have been able to resolve FM audio artifacts, these receivers still face issues with meeting adjacent channel selectivity, particularly for receivers needing to operate ETSI requirements of 70 dB attenuation at 25 kHz channel spacing.

FIG. 1 is a spectrum graph 100 illustrating the adjacent channel selectivity problem associated with a very low IF receiver. Channel spacing frequency 150 is demarked at 12.5 kHz, spacing increments. The receiver is configured to offset a carrier 102 by minus half the channel spacing (−12.5 kHz) 104 (desired signal at −12.5 KHz) with the presence of both adjacent channel interferers for 25 kHz channel spacing, 106, 108. The image of desired signal 104 is shown at 114 as the image of desired signal at +12.5 KHz, with sideband suppression due to IQ imbalance. The image 118 of the low side adjacent channel interferer 108 falls outside of the filter response 110. However, and undesirably, the image 116 of the high side adjacent channel interferer 106 will become the inband noise and interfere with the desired on-channel signal 104. Furthermore, there will be no protection from analog baseband filters for the high side interferer 106, because the baseband filter response 110 has to extend to accommodate the desired on-channel signal 104. Hence, the adjacent channel selectivity (high side) for these low IF configurations is highly dependent on sideband suppression performance prior to low IF translation.

Accordingly, there is need for an improved receiver to resolve FM audio artifacts.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
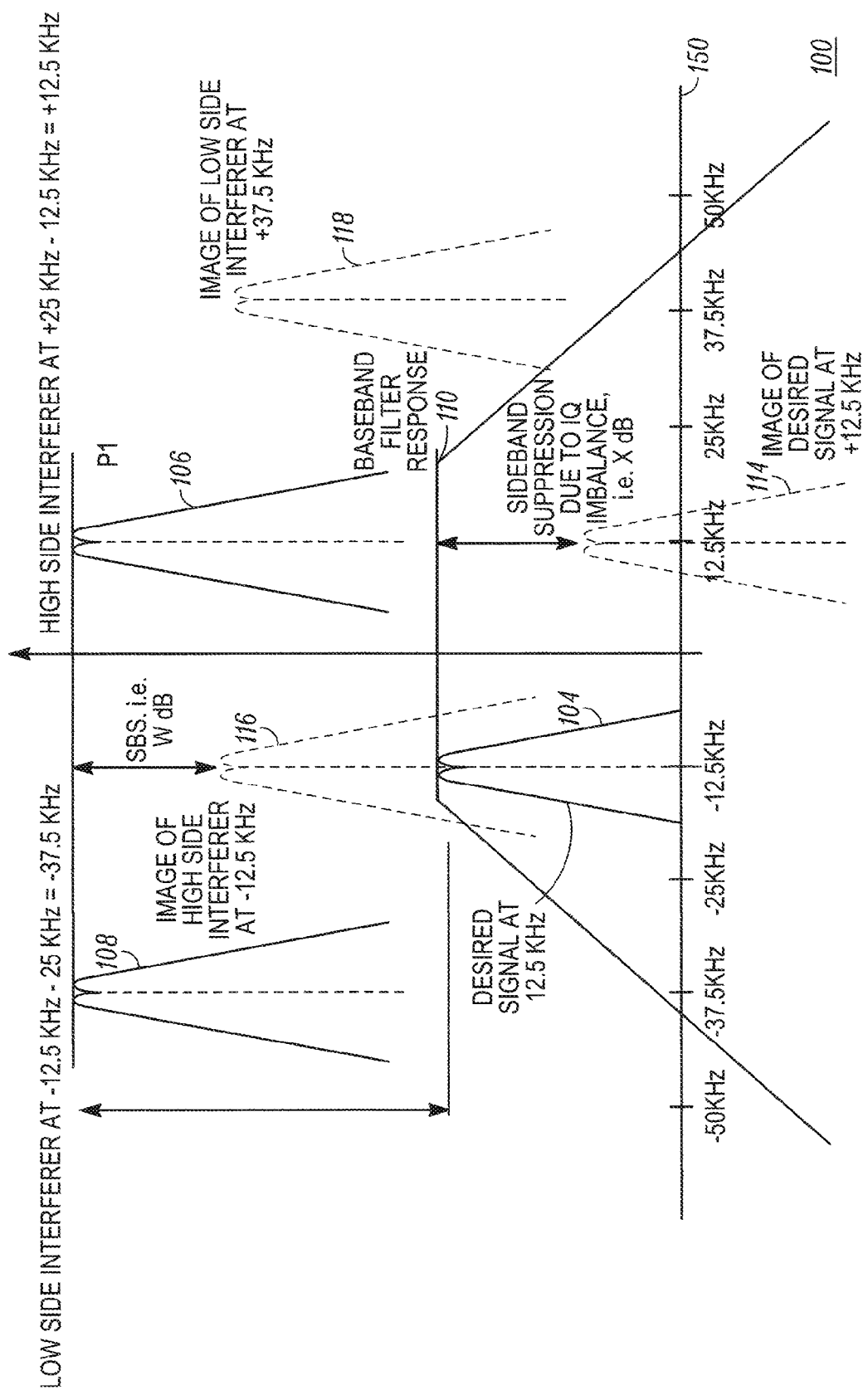
FIG. 1 is a spectrum graph illustrating a prior art low IF configuration spectrum in accordance with the prior art.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Briefly, there is described herein, a direct conversion radio receiver which removes FM DPL subaudible audio artifacts caused by DC offset error and IQ imbalance. The receiver allows radios to be realized in a very low IF architecture through an adaptive frequency translation for different channel spacing as well as an adaptive low IF configuration through different channel spacing. In accordance with the embodiments to be described herein, a very low IF offset will be defined as an offset of 20 to 30% of channel spacing. Radios required to meet ETSI requirements can benefit from such a receiver. Such requirements may include, for example: ETSI 300-086, 60 dB adjacent channel rejection for 12.5 KHz channel spacing system, and 70 dB of adjacent channel rejection for 25 KHz channel spacing, as well as adjacent channel rejection of 40 dB and 70 dB for both 12.5 KHz and 25 KHz respectively per EIA_TIA-603-C specification.

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 2:
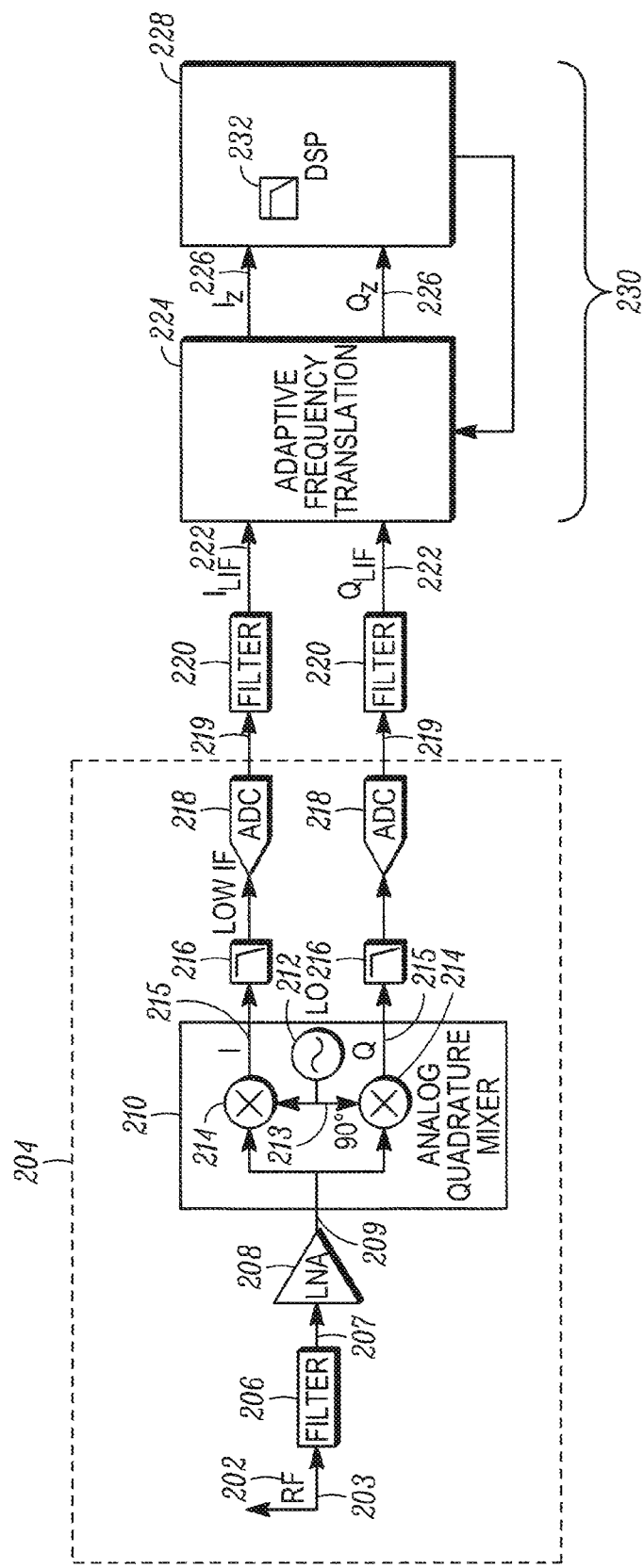
FIG. 2 is a diagram for a receiver formed and operating in accordance with the various embodiments.

FIG. 2 is a diagram of a receiver 200 such as a radio receiver formed and operating in accordance with the various embodiments. Receiver 200 receives a radio frequency (RF) signal 202 which is processed through an RF stage 204 using known circuitry, such as RF filter 206, low noise amplifier (LNA) 208, an analog quadrature mixer 210 having a voltage controlled oscillator 212, mixers 214, lowpass filters 216, analog-to-digital converters (ADC) 218, and digital filters 220. The RF stage 204 generates in-phase and quadrature (I/Q) signals 222. The I/Q signals 222 are digital signals are processed though a baseband processing stage 230 formed and operating in accordance with the various embodiments of the invention to be described herein.

The baseband processing stage 230 comprises an adaptive frequency translation stage 224 controlled via digital signal processor (DSP) 228 or other digital audio processing means, such as ASICs, Gate Arrays, and FPGAs to name a few. The baseband processing stage 230 performs frequency translation that converts Low IF I/Q signals 222 into a Zero IF signal ($I_z$, $Q_z$) 226. The Zero IF signal (Iz, Qz) 226 will then be demodulated to recover FM audio tone.

In operation, receiver, the antenna 203 receives a frequency modulated (FM) signal 202 separated from other signals by a channel spacing. The radio frequency (RF) filter 206 filters the FM signal into a filtered signal 207 which is fed to the low noise amplifier (LNA) 208 for amplifying the filtered signal 207 into an amplified signal 209. The local oscillator 212 digitally generates first and second LO injection signals 213 which are phase offset by substantially 90 degrees (i.e. quadrature phase offset). The first and second LO injection signals 213 also frequency shifted based on the channel spacing. The analog quadrature mixers 214 generate low IF I/Q signals 215 in response to the amplified signal 209 being mixed with each frequency shifted LO injection signal 212.

The I and Q signals are processed down first and second paths, where the first path processes the low IF I signal 215 through a low pass filter 216, an analog-to-digital converter 218 and a digital filter to generate a low IF digital signal ($I_{LIF}$) 222. The second path processes the low IF Q signal 215 through a low pass filter 216, an analog-to-digital converter 218 and a digital filter 220 to generate a low IF digital signal ($Q_{LIF}$) 222. In accordance with the various embodiments, the digital filters 220 may be high-pass filters or notch filters designed to remove undesired DC offset error, present at signals 219, as later shown in FIGS. 3 and 4. The removal of undesired DC offset is executed prior to the adaptive frequency translation 224.

In accordance with the various embodiments, an adaptive frequency translator 224 provides adaptive frequency offsetting of the low IF digital signal ($I_{LIF}$) 222 and low IF digital signal ($Q_{LIF}$) 222 into a baseband signal ($I_z$, $Q_z$) 226 without amplitude and phase imbalance by: applying, to the low IF digital signal ($I_{LIF}$), a first predetermined frequency offset for 12.5 kHz channel spacing, applying a second predetermined frequency offset for 20 kHz channel spacing; and by applying a third predetermined frequency offset for 25 kHz channel spacing; and by applying, to the low IF digital signal ($Q_{LIF}$), the first predetermined frequency offset for 12.5 kHz channel spacing, applying a second predetermined frequency offset for 20 kHz channel spacing; and by the third predetermined frequency offset for 25 kHz channel spacing. In accordance with an embodiment, the low IF digital signal ($I_{LIF}$, $Q_{LIF}$) 222 may be adaptively offset by the adaptive frequency translator 224 to between 20 percent to 30 percent of the channel spacing. The adaptive frequency translation 224 may be adapted for different channel spacing depending on system requirements. In accordance with the various embodiments, the low IF offset is defined as 20 to 30% of channel spacing A digital signal processor (DSP) 228 (or other control device) can be used to control the adaptive frequency translator 224 or alternatively, the adaptive frequency translator 224 may be integrated within the DSP 228, as part of an overall controller 230.

In accordance with the various embodiments, the adaptive frequency translator 224 digitally down mixes the low IF digital signal ($I_{LIF}$, $Q_{LIF}$) 222 back to baseband (0 Hz) 226. The DSP 228 comprises a DSP IF filter (a low pass filter) 232 to provide adjacent channel rejection and remove sideband image from the baseband signal 226, as shown and discussed in conjunction with FIGS. 6 and 7. Alternatively, this low pass filtering of the low IF digital signal ($I_{LIF}$, $Q_{LIF}$) 222 can be accomplished within the adaptive frequency translator 224 itself. Thus, in accordance with the various embodiments, the digital controller 230 provides adaptive frequency translation for different channel spacing and adaptive low IF configuration thru for different channel spacing.

Spectrum plots provided in FIGS. 3, 4, 5, 6, and 7 demonstrate how the very low IF receiver 200 is resolves audio artifacts caused by DC offset and IQ imbalance in the channel signal, in accordance with the various embodiments. The wanted in-band signal at 0 Hz baseband signal is further obtained through the use of frequency translation in accordance with the various embodiments.

Figure 3:
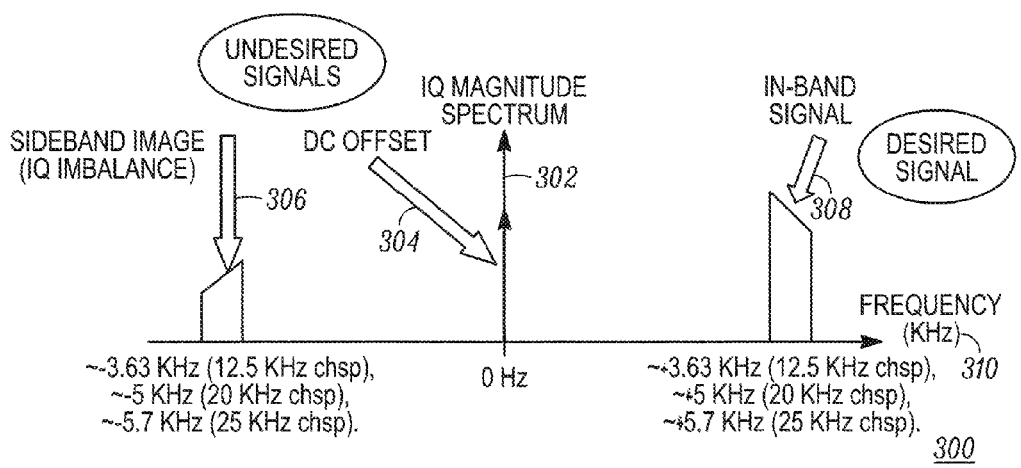
FIG. 3 is a spectrum graph of a baseband signal on very low IF receiver that is receiving an on-channel signal prior to translation in accordance with the various embodiments.

FIG. 3 is a spectrum plot 300 of a very low IF receiver, operating in accordance with the various embodiments, receiving an on-channel signal with low side first LO (LO is below carrier), prior to frequency translation. It should be noted the VLIF embodiment is also operational for high side injection (LO above carrier). The results are mirror image of the low side injection. Plot 300 represents, for example, the signal 219 of FIG. 2 and shows frequency 310 along the x-axis and IQ magnitude spectrum along the y-axis 302. A DC offset error 304 is present at baseband (0 Hz) and is considered an undesired signal which may be caused by numerous sources, such as LO leakage and baseband amplifier characteristics, to name a few. In accordance with the various embodiments, the low IF frequency, is adapted to within a predetermined range (e.g. 20 percent to 30 percent) of system channel spacing, to mix down RF to an in-band signal 308, which is considered a desired signal. For example, a low IF frequency of approximately 3.64 KHz may be utilized for 12.5 KHz channel spacing, a low IF frequency of approximately 5 kHz may be utilized for 20 kHz channel spacing, and a low IF frequency of approximately 5.714 KHz may be utilized for 25 KHz channel spacing.

Along with the desired signal 308, the analog quadrature down mixer 210 of FIG. 2 creates a sideband image 306. This sideband image 306 is caused by phase and amplitude imbalances (IQ imbalance) in the analog quadrature mixer 210, which are inherent imperfections in the hardware of the direct conversion receiver (DCR) 200. Sideband image 306 is considered an undesired signal. Thus, both DC offset 304 and sideband image 306 are considered undesired signals which the receiver operation in accordance with the various embodiments resolves.

Since the desired signal 308 is separated from the undesired DC offset error 304, an accurate and faster DC tracking method can now be used to remove the DC offset error from the baseband signal.

The designator numbers have been updated through the progression of each plot for FIGS. 3, 4, 5, 6, and 7 to facilitate review. For example designators 308, 408, 508, 608 and 708 refer to the in-band signal. Designators 304, 404 refer to the DC offset. Designators 412, 512 refer to the high pass filter (or notch filter). Designator 712 refers to an in-band IQ filter.

Figure 4:
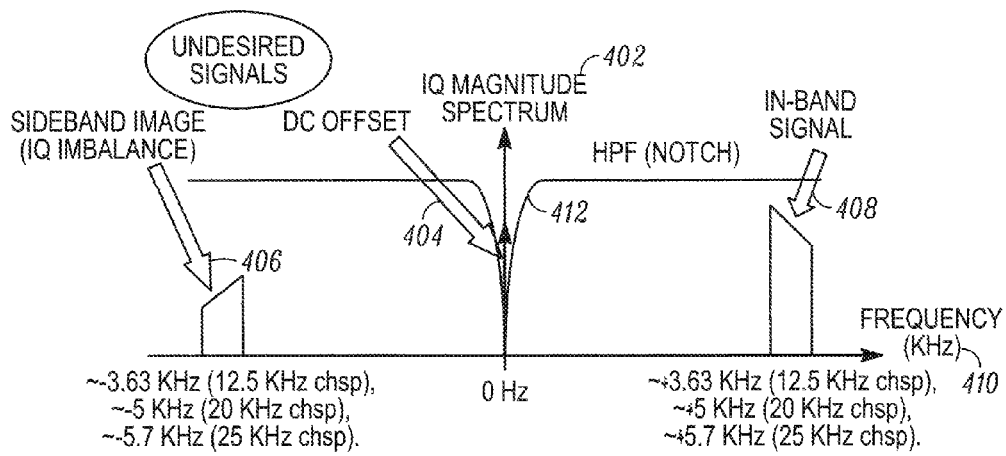
FIG. 4 is a plot showing the application of a high pass filter or notch filter to remove the DC offset cleanly without corrupting the desired in-band signal in accordance with the various embodiments.

FIG. 4 is a plot 400 showing the application of the high pass filter or notch filter 220 of FIG. 2, shown here as filter 412, to remove the DC offset 404 cleanly without corrupting the desired in-band signal 408. FIG. 4 shows frequency 410 along the horizontal axis and IQ magnitude spectrum along the vertical axis 402.

Figure 5:
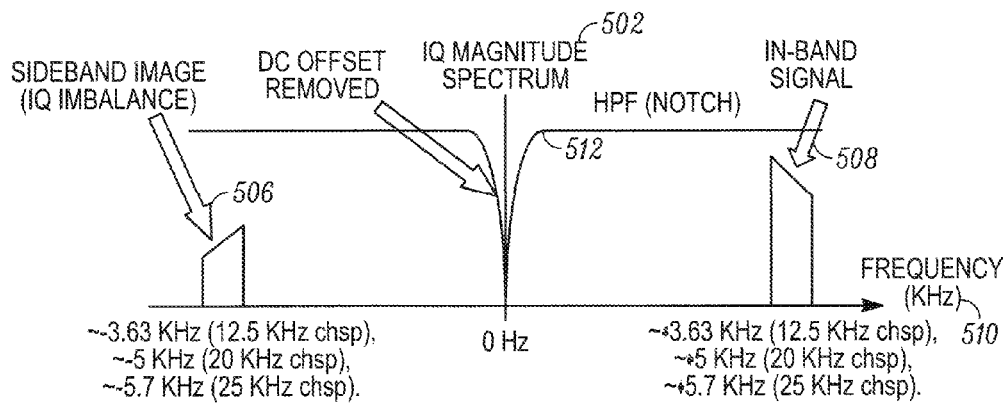
FIG. 5 is a plot showing the baseband signal 0 Hz (without any DC offset), the in-band signal, and the sideband image in accordance with the various embodiments.

FIG. 5 is a plot 500 showing the baseband signal 0 Hz (without any DC offset), the in-band signal 408, and the sideband image 406. The plot 500 is representative of signal 222 of FIG. 2. FIG. 5 shows frequency along the horizontal axis 510 and IQ magnitude spectrum along the vertical axis 502.

Figure 6:
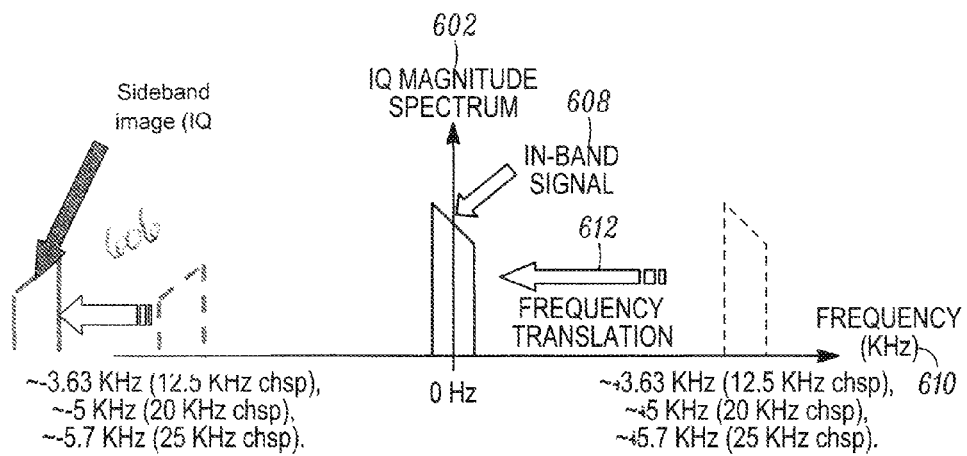
FIG. 6 is a plot of frequency translation being applied after the DC offset has been removed in accordance with the various embodiments.

Moving to FIG. 6, after the DC offset has been removed, the frequency translation 612, such as by frequency translator 224 from FIG. 2, is applied in accordance with the various embodiments. FIG. 6 shows frequency 610 along the horizontal axis and IQ magnitude spectrum along the vertical axis 602. The frequency translation 612 is applied to digitally down mix the desired in-band signal 608 back to baseband (0 Hz). This process also shifts the sideband image 606 further away (about 7.3 kHz for 12.5 khz, 10 khz for 20 khz and 11.4 kHz for 25 kHz channel spacing. Plot 600 represents signal 226 of FIG. 2. In other words, the $I_{LIF}$, $Q_{LIF}$ signal 222 of FIG. 2 has been shifted 612 to zero IF by frequency translator 224 thereby generating Iz, Qz signals 226 which are in-band baseband signals.

Figure 7:
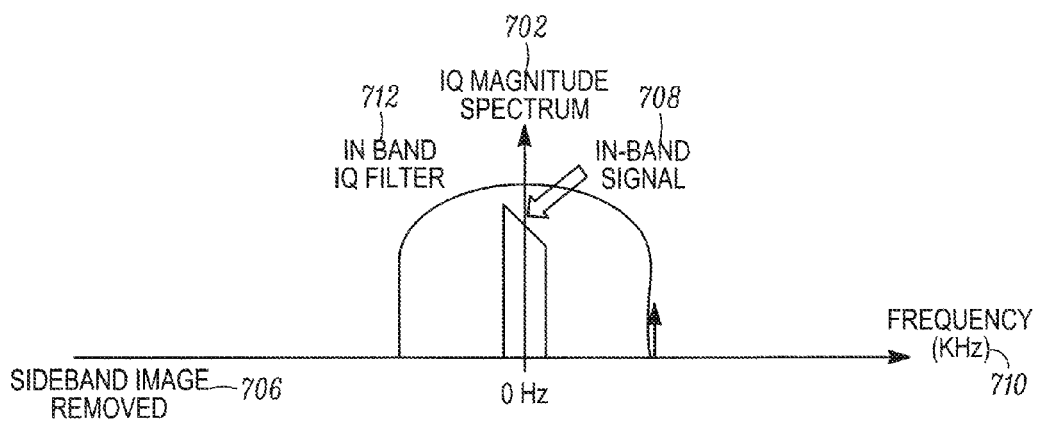
FIG. 7 is a plot of application of the desired in-band signal 308 at baseband after application of a DSP IF filter in accordance with the various embodiments.

FIG. 7 shows the application of a DSP IF filter 712 (such as low pass filter 232 of FIG. 2) to provide adjacent channel rejection and remove the sideband image 706 for the on-channel signal, leaving only the desired in-band signal 708 at baseband. FIG. 7 shows frequency 710 along the horizontal axis and IQ magnitude spectrum along the vertical axis 702. Sideband image has been pushed out of band. Additionally, the bandwidth of the DSP IF filter 712 (or 232 of FIG. 2) is changeable with FM channel spacing. Thus, if the DC offset error 404 is not completely removed by the high pass filter or notch filter 512 (at FIG. 5), then the DSP IF filter 232 can provide an additional predetermined amount of protection from this DC offset error, for example, 0 to 15 dB.

Figure 8:
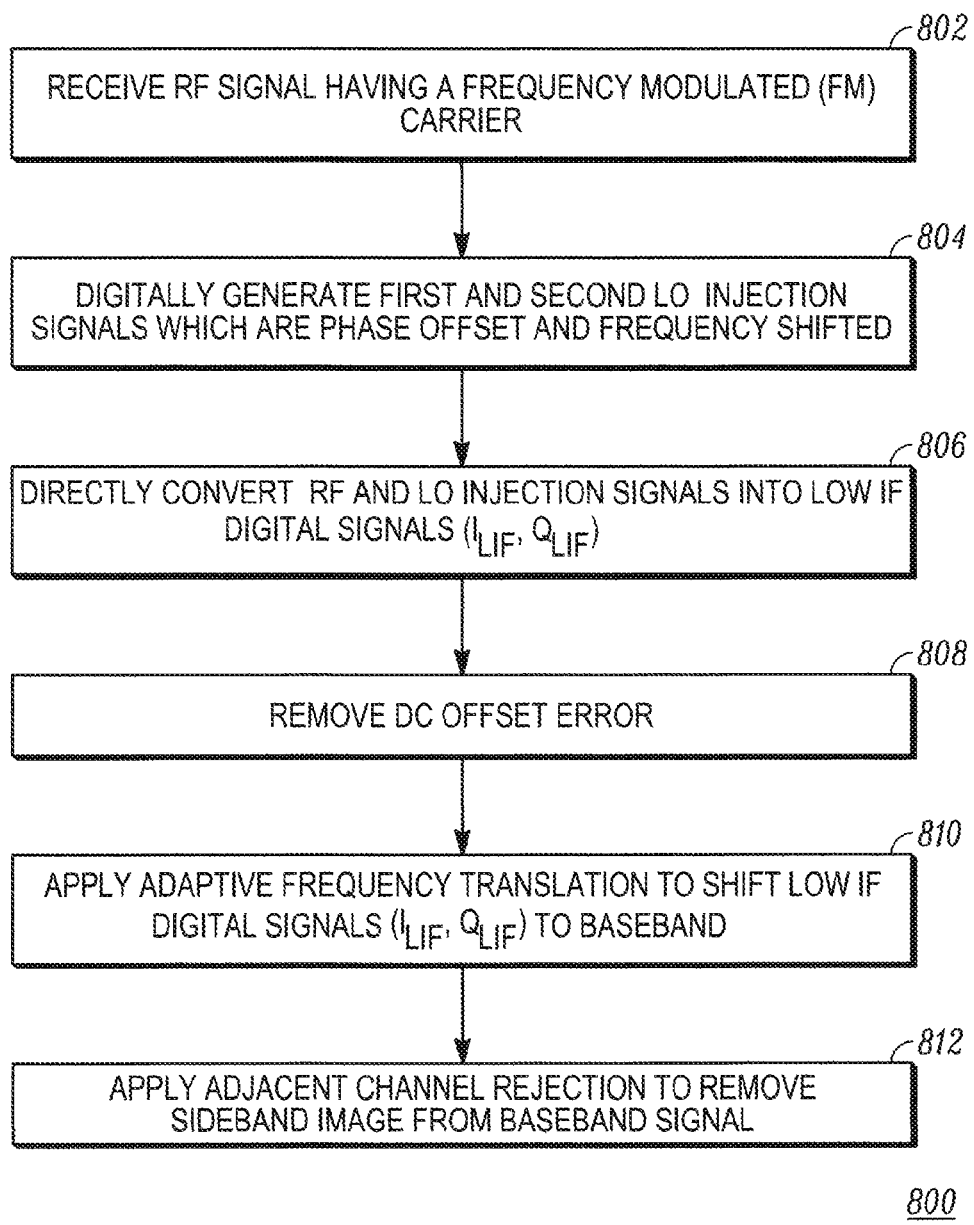
FIG. 8 is a flowchart of a method for resolving FM audio artifacts and adjacent channel selectivity in accordance with the various embodiments.

FIG. 8 is a flowchart of a method 800 for resolving FM audio artifacts and adjacent channel selectivity in accordance with an embodiment of the invention. Method 800 begins at 802 by receiving a radio frequency (RF) signal having a frequency modulated (FM) carrier. Digital first and second LO injection signals are generated at 804 which are phase offset and frequency shifted, the frequency shift being based on channel spacing of the radio. The RF signal and LO injection signals are directly converted into low IF digital signals ($I_{LIF}$, $Q_{LIF}$) at 806. Removal of DC offset error from the low IF digital signal ($I_{LIF}$, $Q_{LIF}$), such as by low pass filtering or notch filtering, takes place at 808. After removal of the DC offset error at 808, the adaptive frequency translation is applied at 810 to the low IF digital signals ($I_{LIF}$, $Q_{LIF}$) to digitally down mix the desired in-band signal back to baseband (0 Hz) and push the undesired image out of band. At 812, adjacent channel rejection is applied along and removal of sideband image from the baseband signal. The application of adjacent channel rejection and removal of sideband noise may be accomplished, for example, by filtering the baseband signal with a low pass filter. Such a low pass filter may be integrated as part of the DSP, such as filter 232 of DSP 228 of FIG. 2.

Figure 9:
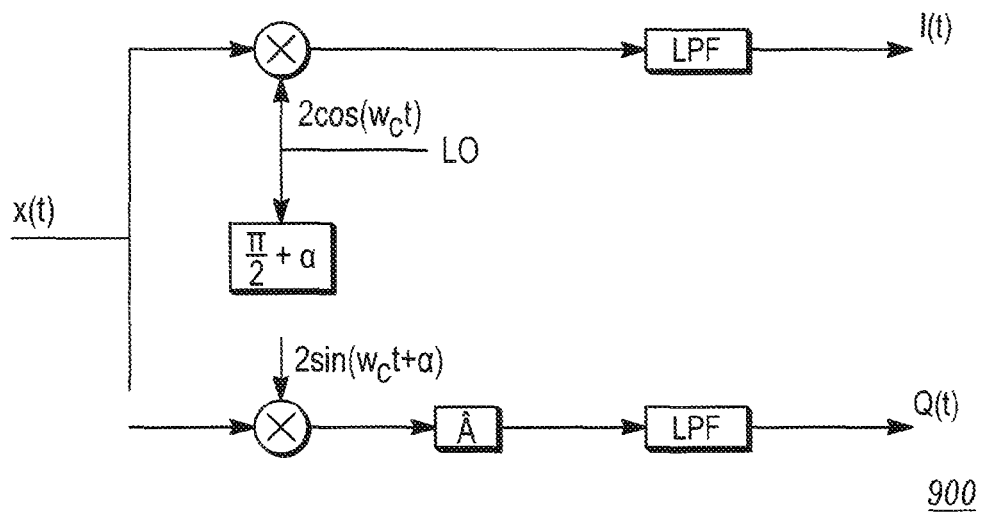
FIG. 9 is an example of a model to compute and compensate for IQ imbalance in accordance with the various embodiments.

FIG. 9 is an example of a model to compute and compensate for IQ imbalance in accordance with an embodiment of the invention. To accommodate different channel spacing with the objective of resolving adjacent channel selectivity such as faced by the prior art discussed earlier, a configurable frequency translation is realized. By changing the numerical signal frequency of the complex frequency translation, different frequencies of low IF signal (3.6 kHz, 5.7 kHz, etc.) can be translated back to zero IF.

Hence, $$Iz + jQz = (I_{LIF} + jQ_{LIF}) \cdot (I_N + jQ_N) \quad (1)$$
$$= (I_{LIF} \cdot I_N - Q_{LIF} \cdot Q_N) + j(I_{LIF} \cdot Q_N + Q_{LIF} \cdot I_N)$$

where:
($I_{LIF}$+$jQ_{LIF}$) is the complex representation of Low IF signal,
($I_N$+$jQ_N$) is the complex representation of DSP generated complex signal for frequency translation, numerical signal, and
Iz+jQz is the complex representation of translated zero IF signal.

In order to meet adjacent channel rejection for both TIA and ETSI specifications, the low IF frequency is adaptively set to about 20 percent to 30 percent of the system channel spacing. The 20 to 30 percent of low IF frequency offset reduces the energy of the adjacent channel's image that would otherwise intercept the on-channel signal. Thus, the 20 to 30 percent offset provides improved adjacent channel selectivity, while at the same time, resolving audio artifacts caused by DC offset error. In accordance with the various embodiments, it is desirable to have the IQ imbalance correction performed prior to the frequency translation. This allows for the consideration of the spectral energy for the image of the adjacent channel interferer that might fall in band, and also maintains consistency in adjacent channel rejection, which could otherwise be degraded by sideband suppression performance issues (temperature variation, components variation).

Figure 10:
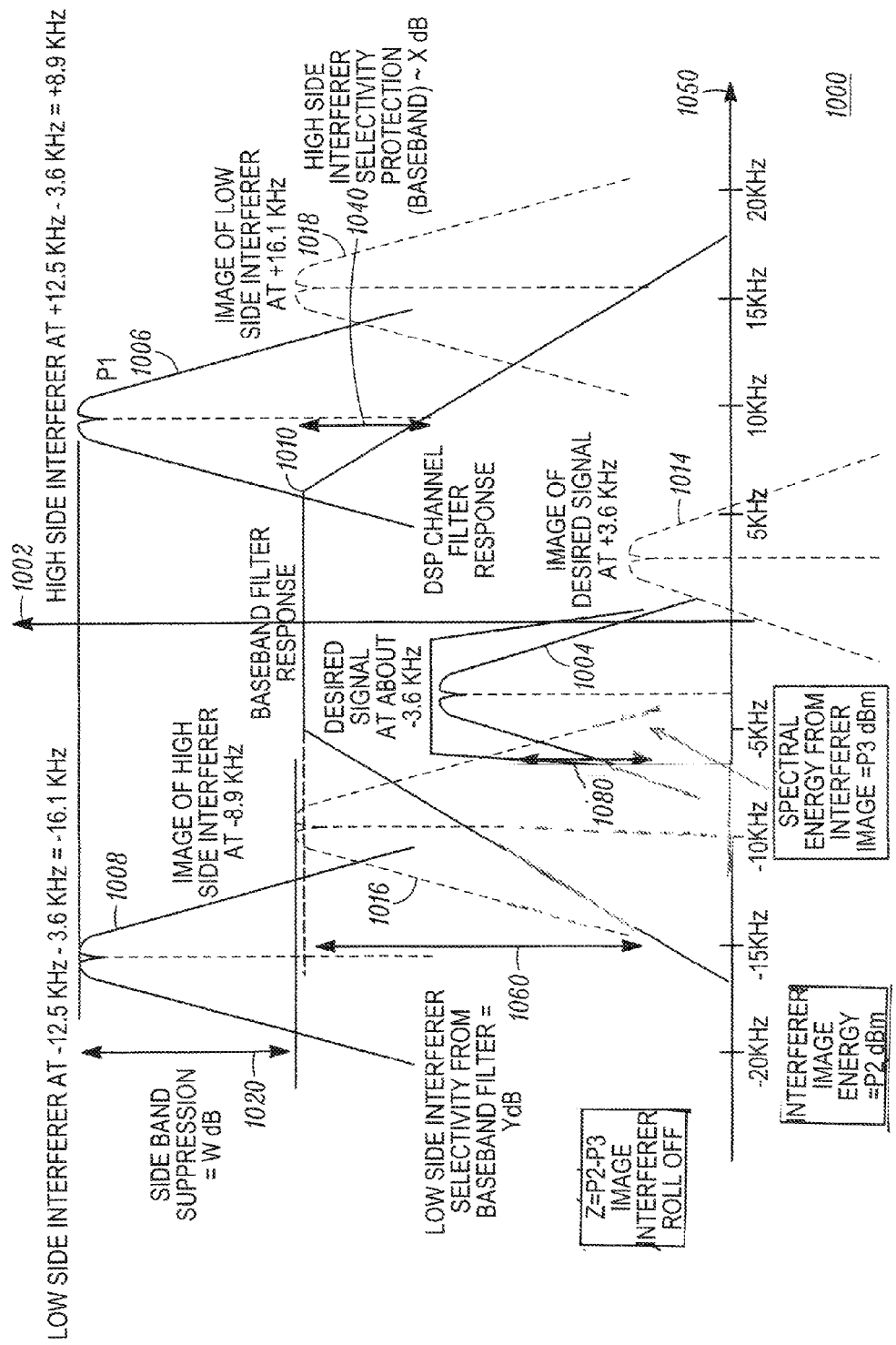
FIG. 10 is an example of a frequency spectrum plot for a low IF stage prior to frequency translation in accordance with the various embodiments.

FIG. 10 shows a frequency spectrum plot 1000 for a low IF stage prior to frequency translation. For example, the plot 1000 might be viewed as signal 222 prior to frequency translation 224 of FIG. 2. Frequency 1050 is marked along the horizontal axis and relative magnitude is represented by vertical axis 1002. Frequency spectrum plot 1000 shows an example of a 12.5 kHz channel spaced system with 3.6 kHz low IF frequency 1004, along with the presence of two adjacent channel interferers 1006, 1008.

Referring to plot 1000:

"$W_{dB}$" represents the sideband suppression 1020 of the analog quadrature mixer 210 which is a function of quadrature accuracy and amplitude imbalance. Without a real time software calculation and real time compensation, 40 to 50 dB might be achievable. However, with software correction (to compensate for hardware), it is feasible to achieve 55 dB of sideband suppression.

"$X_{dB}$" represents the baseband filter selectivity 1040 for the high side interferer 1006. Since the baseband filter 1010 is widened for low IF, there may not be a lot of protection from the high side interferer 1006 at baseband (0 Hz). For a worst case scenario, the baseband filter selectivity 1040 may only provide 0 dB protection from the high side interferer 1006.

"$Y_{dB}$" represents the baseband filter selectivity 1060 for the low side interferer 1008. Since the low side interferer 1008 is located further away from the baseband filter 1010, it is anticipated that, the analog hardware baseband filter 1010 provides sufficient attenuation for this low side interferer, based on DCR architectures. Low side filter selectivity 1060 of baseband filter 1010 can be anticipated to be provide more than 15 to 20 dB of protection from the low side interferer 1008.

"Z" represents the baseband interferer's image roll off factor 1080 (for the positive interferer 1006 (via image 1016) that might intercept the on-channel signal 1004 and become in-band noise. This roll off factor 1080 is a function of an interferer test signal, frequency offset, and channel bandwidth. For the ETSI standard that utilizes FM standard deviation with a 400 Hz tone, the roll off is about 24 dB for 12.5 kHz channel spacing with a 5.2 kHz offset (using 6 kHz channel bandwidth). For the EIA/TIA603C standard that utilizes two tones with maximum deviation (wider spectrum), the measured roll off is about 13 dB with the same channel bandwidth.

Figure 11:
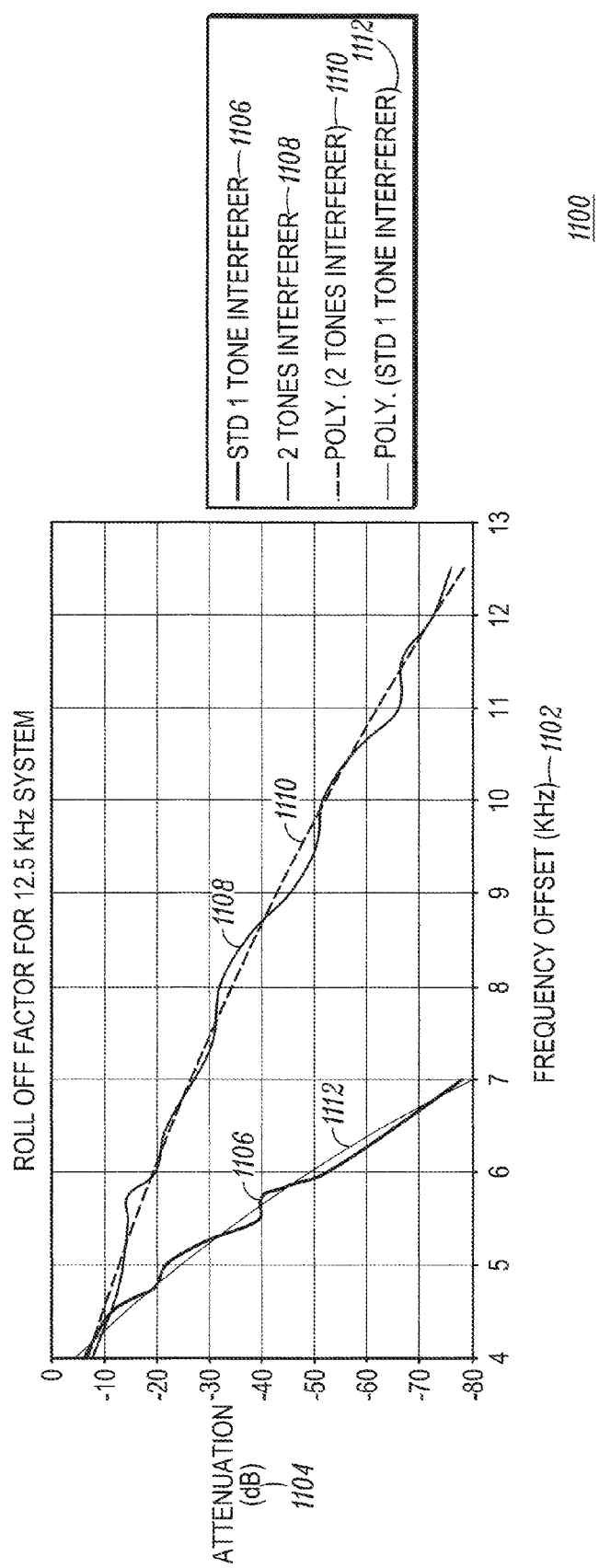
FIG. 11 is an example of a plot of a roll off factor for a 12.5 kHz system in accordance with the various embodiments.

FIG. 11 shows an example of a plot 1100 showing an example of the roll off factor for a 12.5 kHz system. Plot 1100 shows frequency offset (kHz) 1102 on the horizontal axis and attenuation (dB) 1104 on the vertical axis. Both one tone interferer 1106, 1112, and 2 tone interferer 1108, 1110 with different frequency offsets of 6 kHz are shown. Curves 1106 and 1108 are measured data, while curves 1110 and 1112 are excel curve fit line (poly). Plot 1100 thus shows the advantageous improvement in roll off by utilizing the adjacent channel selectivity operating in accordance with the various embodiments.

Adjacent channel selectivity for the low IF approach provided by the various embodiments will meet ETSI ACS requirements. As an example, assuming, for a one tone interferer, there is no limitation in dynamic range and LO phase noise, the adjacent channel rejection positive side ACS (+) for 12.5 kHz can be estimated as:

$$ACS(+) = W + X + Z - CO\text{-CHANNEL}$$
$$= 45 + 0 + 24 - 5(\text{dB})$$
$$= 64 \text{ dB}$$

The above being based on assumption of 45 dB sideband suppression from hardware without IQ imbalance correction, no protection from baseband filter, measured 24 dB roll off from the image interferer, and 5 dB co-channel. Therefore, there will be no issue with meeting ETSI ACS requirements.

Adjacent channel selectivity for the low side interferer ACS(−) will not depend on IQ imbalance correction as the image interferer will be located further away from the desired signal. Therefore, adjacent channel selectivity ACS(−) will not have issues with the low IF approach provided by the various embodiments.

Adjacent channel selectivity for the low IF approach provided by the various embodiments will meet two tones TIA standards. The TIA two tones method, the adjacent channel performance will be reduced due to the roll off factor for the two tones interferer (with maximum deviation) is lesser as compared with ETSI standard that uses single 400 Hz tone with standard deviation. The estimated two tones ACS performance is shows below:

$$ACS(+) = W + X + Z - CO\text{-CHANNEL}$$
$$= 45 + 0 + 13 - 5(\text{dB})$$
$$= 53 \text{ dB}$$

The above being based on assumption of 45 dB sideband suppression from hardware without IQ imbalance correction, no protection from baseband filter, measured 13 dB roll off for two tones interferer, and 5 dB co-channel. This performance well exceeds 40 dB of the TIA specification.

To maintain consistency and ACS performance IQ imbalance correction/compensation can be utilized to improve sideband suppression performance further and improve two tone ACS performance.

When adaptive frequency translation with software/hardware correction is applied the ACS performance for two tones can be more than 60 dB, as estimated below:

$$ACS(+) = W + X + Z - CO\text{-CHANNEL}$$
$$= 55 + 0 + 13 - 5(\text{dB})$$
$$= 63 \text{ dB}$$

The above being based on assumption of 55 dB of sideband suppression with IQ imbalance correction, no protection from baseband filter, measured 13 dB roll off for two tones interferer, and 5 dB co-channel, no limitation in LO phase noise and dynamic range.

Figure 12:
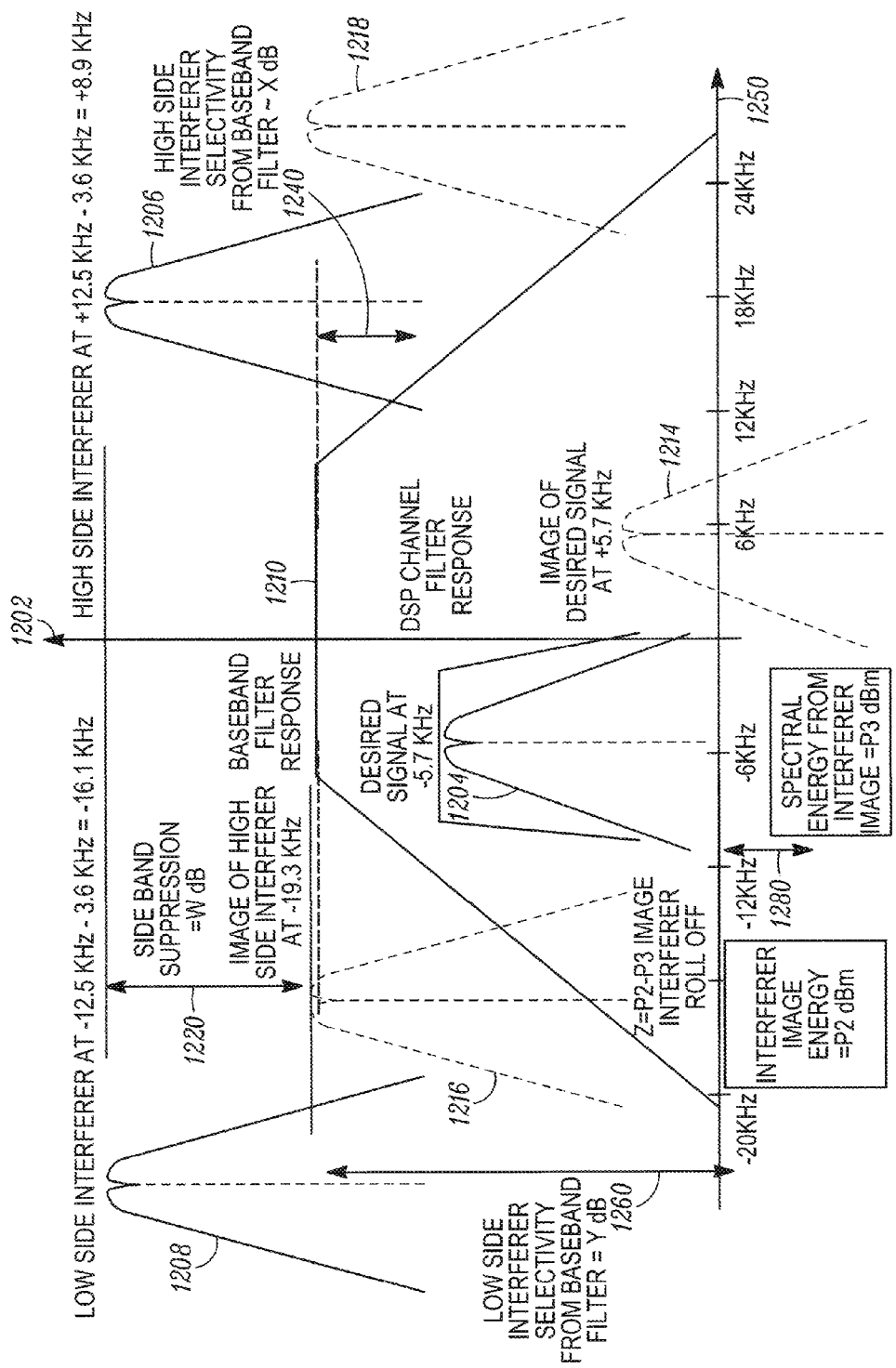
FIG. 12 is another example of a frequency spectrum plot for a low IF stage prior to frequency translation in accordance with the various embodiments.

FIG. 12 shows another example of a frequency spectrum plot 1200 for a low IF stage prior to frequency translation in accordance with the various embodiments. For example, the plot 1200 might be viewed as signal 222 prior to frequency translation 224 of FIG. 2. Frequency 1250 is marked along the horizontal axis and relative magnitude is represented by vertical axis 1202. Frequency spectrum plot 1200 shows an example of a 25.5 kHz channel spaced system with 5.7 kHz low IF frequency 1204, along with the presence of two adjacent channel interferers 1206, 1208.

Referring to plot 1200:

"$W_{dB}$" represents the sideband suppression 1220 of the analog quadrature mixer 210 which is a function of quadrature accuracy and amplitude imbalance. Without a real time software calculation and real time compensation, 40 to 50 dB might be achievable. However, by utilizing software correction (to compensate for hardware), it is feasible to achieve 55 dB of sideband suppression.

"$X_{dB}$" represents the baseband filter selectivity 1240 for the high side interferer 1206. Since the baseband filter 1210 is widened for low IF, there may not be a lot of protection from the high side interferer 1206 at baseband (0 Hz). However, for 25 kHz channel spacing, 10-15 dB of protection from the high side interferer 1206 can be achieved.

"$Y_{dB}$" represents the baseband filter selectivity 1260 for the low side interferer 1208. Since the low side interferer 1208 is located further away from the baseband filter 1210, it is anticipated that, the analog hardware baseband filter 1210 provides sufficient attenuation for this low side interferer.

"$Z$" represents the image interferer roll off 1280, for the positive interferer 1206 via image 1216, that might intercept the on-channel signal 1204 and become in-band noise. The roll off 1280 is a function of an interferer test signal, frequency offset, and channel bandwidth. For the ETSI standard that utilizes FM standard deviation with a 400 Hz tone, the roll off more than 77 dB for 25 kHz channel spacing with a 13.6 kHz offset (using 11 kHz channel bandwidth). For the EIA/TIA-603C standard that utilizes two tones with maximum deviation (wider spectrum), the measured roll off is about 35 dB.

Figure 13:
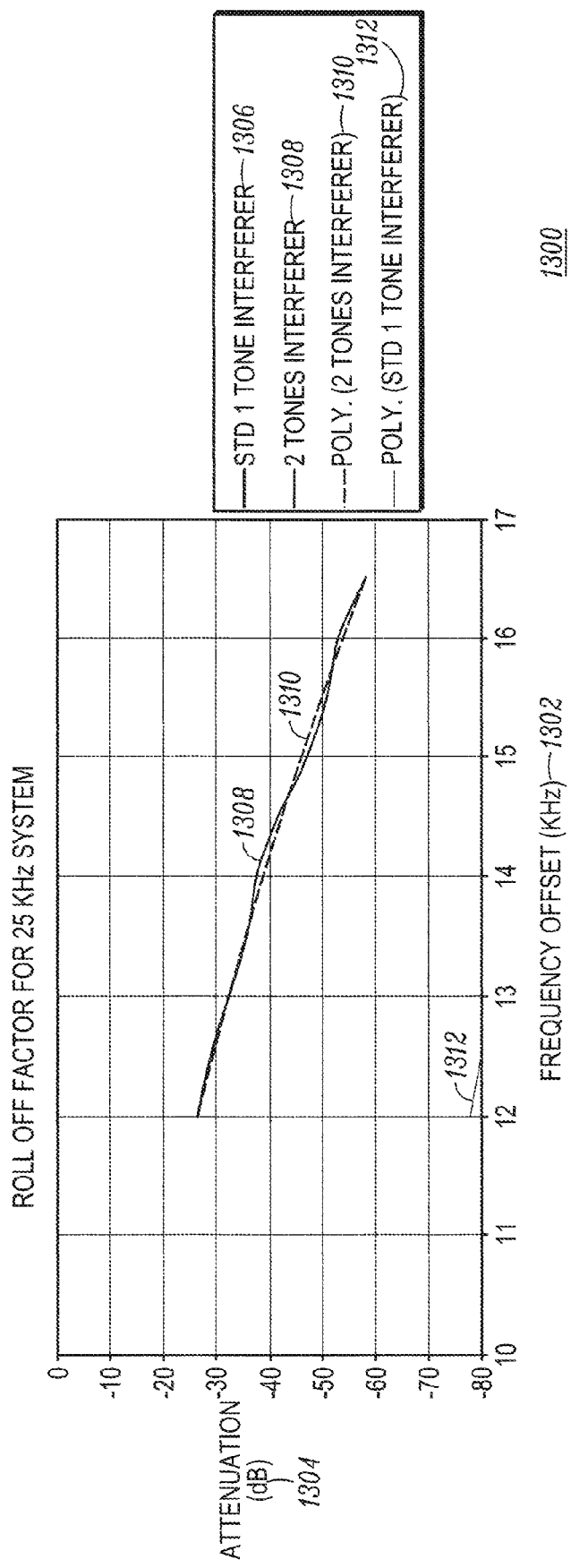
FIG. 13 is an example of a plot showing roll off factor for a 25.0 kHz system in accordance with the various embodiments.

FIG. 13 an example of a plot 1300 showing an example of the roll off factor for a 25.0 kHz system. Plot 1300 shows frequency offset (kHz) 1302 on the horizontal axis and attenuation (dB) 1304 on the vertical axis. Both one tone interferer 1306, 1312, (1306 are 1312 are basically overlapped in this graph) and two tones interferer 1308, 1310 with different frequency offsets of 11 kHz are shown. Plot 1300 thus shows the advantageous improvement in roll off by utilizing the adjacent channel selectivity operating in accordance with the various embodiments.

Adjacent channel selectivity for the low IF approach provided by the various embodiments will meet ETSI ACS requirements. As an example, assuming, for a one tone interferer, there is no limitation in dynamic range and LO phase noise, the adjacent channel rejection positive side ACS (+) for 25.0 kHz can be estimated as:

$$ACS(+) = W + X + Z - CO\text{-CHANNEL}$$
$$= 45 + 10 + 78 - 3(\text{dB})$$
$$= 125 \text{ dB}$$

The above being based on assumption of 45 dB sideband suppression from hardware without IQ imbalance correction, 10 dB baseband filter protection, measured 78 dB roll off (with 13.6 kHz offset, 11 kHz noise bandwidth), and 3 dB co-channel. Therefore, there will be no issue with meeting ETSI ACS requirements.

Adjacent channel selectivity for the low side interferer ACS(−) will not depend on IQ imbalance correction as the image interferer will be located further away from the desired signal. Therefore, adjacent channel selectivity for the low side interferer ACS(−) will not have issues with the low IF approach provided by the various embodiments.

Adjacent channel selectivity for the low IF approach provided by the various embodiments will meet the two tone TIA standard. The adjacent channel performance will be slightly reduced, because the roll off factor for the two tones interferer (with maximum deviation) is less than the ETSI standard which uses a single 400 Hz tone with standard deviation. The estimated two tones ACS performance is shown as follows:

$$ACS(+) = W + X + Z - CO\text{-CHANNEL}$$
$$= 45 + 10 + 35 - 3(\text{dB})$$
$$= 87 \text{ dB}$$

The above being based on assumption of 45 dB sideband suppression from hardware without IQ imbalance correction, 10 dB protection from the baseband filter, measured 35 dB roll off factor for two tones interferer, and 3 dB co-channel. Therefore, adjacent channel selectivity (ACS) performance is not a problem for 25 kHz channel spacing.

Accordingly, there has been provided a method and apparatus for reducing FM audio artifacts in a receiver. The direct conversion radio frequency (RF) receiver converts an analog FM signal into a phase shifted digital low IF signal. A digital controller coupled to the analog FM receiver provides adaptive frequency translation for predetermined different channel spacing and adaptive low IF configuration through the predetermined different channel spacing, thereby suppressing audio artifacts.

A receiver incorporating the frequency translation provided by the various embodiments meets adjacent channel selectivity for the TIA (40/70 for two tones ACS) standard and the ETSI (60/70 dB) standard. Audio performance has been evaluated. The overall audio performance is comparable to tested legacy dual conversion receivers. No noticeable audio artifact was heard during steady state and dynamic conditions.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including", "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A radio receiver, comprising:
an antenna for receiving a frequency modulated (FM) signal separated from other signals by a channel spacing;
a radio frequency (RF) filter for filtering the FM signal into a filtered signal;
a low noise amplifier (LNA) for amplifying the filtered signal into an amplified signal;
a local oscillator for digitally generating a first LO injection signal and a second LO injection signal which are phase offset, the first and second LO injection signals also being frequency shifted based on the channel spacing;
an analog quadrature mixer for generating low IF I/Q signals in response to the amplified signal being mixed with the frequency shifted LO injection signals;
a first path for processing the low IF I signal through a low pass filter, an analog-to-digital converter and a digital filter to generate a low IF digital signal ($I_{LIF}$);
a second path for processing the low IF Q signal through a low pass filter, an analog-to-digital converter and a digital filter to generate a low IF digital signal ($Q_{LIF}$);
an adaptive frequency translator for adaptively frequency offsetting the low IF digital signal ($I_{LIF}$) and low IF digital signal ($Q_{LIF}$) into a baseband signal without amplitude and phase imbalance by:
applying, to the low IF digital signal ($I_{LIF}$), a first predetermined frequency offset for 12.5 kHz channel spacing, applying a second predetermined frequency offset for 20 kHz channel spacing and by applying a third predetermined frequency offset for 25 kHz channel spacing; and
applying, to the low IF digital signal ($Q_{LIF}$), the first predetermined frequency offset for 12.5 kHz channel spacing and by the second predetermined frequency offset for 25 kHz channel spacing.

2. The radio receiver of claim 1, further comprising:
a digital signal processor (DSP) for controlling the adaptive frequency translator.

3. The radio receiver of claim 1, wherein the adaptive frequency translator is formed as part of a digital signal processor.

4. The radio receiver of claim 1, wherein each filter within the first path and the second path comprises a high pass filter or a notch filter to remove DC offset from the low IF digital signal prior to frequency translation.

5. The radio receiver of claim 1, the adaptive frequency translator digitally down mixes the low IF digital signal back to baseband (0 Hz).

6. The radio receiver of claim 5, wherein the DSP comprises a low pass filter to provide adjacent channel rejection and remove sideband image from the baseband signal.

7. The radio receiver of claim 1, wherein the low IF digital signal is adaptively offset by the adaptive frequency translator to between 20 percent to 30 percent of the channel spacing.

8. A radio, comprising:
a direct conversion radio frequency (RF) receiver for converting an analog FM signal into a phase shifted digital low IF signal, wherein the digital low IF signal is obtained through an analog quadrature mixer converting first and second digital LO signals and an RF input to generate the phase shifted digital low IF signal; and
a digital controller coupled to an analog FM receiver, the digital controller providing adaptive frequency translation for predetermined different channel spacing and adaptive low IF configuration through the predetermined different channel spacing, thereby suppressing audio artifacts.

9. The radio of claim 8, wherein the adaptive frequency translation is performed in accordance with a mathematical formula as follows:

$$Iz + jQz = (I_{LIF} + jQ_{LIF}) \cdot (I_N + jQ_N)$$
$$= (I_{LIF} \cdot I_N - Q_{LIF} \cdot Q_N) + j(I_{LIF} \cdot Q_N + Q_{LIF} \cdot I_N)$$

where:
($I_{LIF}$+j$Q_{LIF}$) is the complex representation of Low IF signal,
($I_N$+j$Q_N$) is the complex representation of DSP generated complex signal for frequency translation, numerical signal, and
Iz+jQz is the complex representation of translated zero IF signal; and
and where $I_N$ and $Q_N$ change according to channel spacing.

10. The radio of claim 8, wherein the adaptive frequency translation is configurable.

11. The radio of claim 8, wherein the direct conversion (RF) receiver comprises:
a local oscillator for digitally generating first and second LO injection signals which are phase offset, the first and second LO injection signals also being frequency shifted based on channel spacing; and an analog quadrature mixer for generating low IF I/Q signals in response an RF signal being mixed with the frequency shifted LO injection signals.

12. The radio of claim 11, wherein the adaptive frequency translation offsets the low IF I/Q signal by 20 to 30% of channel spacing.

13. A method for receiving a radio frequency (RF) signal, comprising:
- receiving an RF signal having a frequency modulated (FM) carrier;
- digitally generating a first LO injection signal and a second LO injection signal which are phase offset and frequency shifted, the frequency shift being based on channel spacing of the radio;
- directly converting the RF signal and LO injection signals into low IF digital signals ($I_{LIF}$, $Q_{LIF}$), the low IF digital signals ($I_{LIF}$, $Q_{LIF}$) having an in-band signal and a sideband image;
- removing DC offset error from the low IF digital signals ($I_{LIF}$, $Q_{LIF}$);
- applying, after removal of the DC offset error, an adaptive frequency translation to shift the in-band signal to baseband as an in-band baseband signal, and to shift the sideband image out of band;
- applying adjacent channel rejection to remove the sideband image leaving only the in-band baseband signal.

14. The method of claim 13, wherein removing the DC offset error comprises:
- filtering the low IF digital signals ($I_{LIF}$, $Q_{LIF}$) using a digital high pass filter or notch filter to remove the DC offset error.

15. The method of claim 14, wherein applying the adaptive frequency translation, comprises:
- digitally down mixing the in-band signal back to baseband (0 Hz).

16. The method of claim 15, wherein applying adjacent channel rejection to remove sideband image comprises:
- filtering the baseband signal with a low pass filter.

17. The method of claim 13, wherein applying, after removal of the DC offset error, an adaptive frequency translation further comprises applying an offset to the low IF digital signals ($I_{LIF}$, $Q_{LIF}$) of 20 to 30% of channel spacing.

* * * * *